United States Patent [19]
Brueske et al.

[11] Patent Number: 5,894,592
[45] Date of Patent: Apr. 13, 1999

[54] WIDEBAND FREQUENCY SYNTHESIZER FOR DIRECT CONVERSION TRANSCEIVER

[75] Inventors: Daniel E. Brueske, Plantation, Fla.; Gary A. Kurtzman, Austin, Tex.; Richard B. Meador, Sunrise, Fla.

[73] Assignee: Motorola, Inc., Schaumburg, Ill.

[21] Appl. No.: 08/839,290

[22] Filed: Apr. 17, 1997

[51] Int. Cl.$^6$ .................... H04B 1/40; H04B 1/16; H03C 3/06; H03C 3/00
[52] U.S. Cl. .................... 455/86; 455/87; 455/208; 332/127; 332/144
[58] Field of Search ............. 455/86, 87, 208; 332/127, 144

[56] References Cited

U.S. PATENT DOCUMENTS 4,052,672  10/1977  Enderby et al. .................. 325/147
4,837,853   6/1989  Heck .............................. 455/208
5,079,526   1/1992  Heck .............................. 332/127
5,375,258  12/1994  Gillig ............................. 455/87
5,444,865   8/1995  Heck .............................. 455/86

*Primary Examiner*—William Cumming
*Attorney, Agent, or Firm*—Frank M. Scutch, III

[57] ABSTRACT

A wideband phase-lock loop frequency synthesizer (200) used in a radio transceiver capable of being reconfigured to operate in either a transmit, receive, or battery save mode. The wideband phase-lock loop frequency synthesizer (200) includes, a divide-by-two divider (205), quadrature detector (204), offset VCO (209) and offset mixer (207) for generating a quadrature phase modulated signal. Moreover, a programmable filter (211) is used for removing predetermined harmonic components of the offset mixed signal enabling the synthesizer to operate over a wide frequency range.

16 Claims, 4 Drawing Sheets

WIDEBAND FREQUENCY SYNTHESIZER FOR DIRECT CONVERSION TRANSCEIVER

TECHNICAL FIELD

This invention relates in general to electrical circuits and more particularly to frequency synthesizers for direct conversion transceivers.

BACKGROUND OF THE INVENTION

In modern products with transceivers, such as two-way radios and cordless telephones, it is desirable to implement the various radio functions with integrated circuits. A high level of integration is necessary in a modern transceiver to reduce part count, lower cost, and improve reliability. Recently, research has focused on the design of direct conversion receivers as an alternative to the more conventional dual conversion receivers. This type of receiver requires less system complexity than a dual conversion receiver, and as a result it is better suited for complete integration onto a single integrated circuit.

For a direct conversion receiver, the incoming radio frequency (RF) signal is mixed down to baseband or an intermediate frequency that is very close to zero hertz. The RF signal is converted to a baseband signal by mixing with a local oscillator (LO) signal. The LO signal is typically the output signal of a voltage controlled oscillator (VCO) whose frequency is set by a phase lock loop circuit commonly known as a frequency synthesizer. After the conversion, i.e. the down-mixing process, the baseband signal is then filtered and demodulated to provide the desired audio or data signal information.

The design of the LO synthesizer for a direct conversion transceiver typically requires stages common to most phase lock loops: VCO, frequency divider, phase detector, loop filter, and additional circuitry that consist of a 90 degrees phase shifter and frequency controller. The 90 degrees phase shifter provides the in-phase signal (I) and quadrature signal (Q) to the down mixer stage. The frequency controller provides a means for the LO signal to track the frequency of the incoming RF signal. Frequency tracking the LO signal to the incoming RF signal is desirable so that the mixed down baseband signal will exhibit minimal frequency offset (i.e. minimal netting error).

A prior art implementation of such a LO synthesizer for a direct conversion receiver is shown in FIG. 1. The properties and operation of a LO synthesizer, the more generic term being phase locked loop (PLL) are well known. By way of example, the operation of a PLL is discussed in many standard texts such as Gardner, F. M., "Phaselock Techniques", New York: Wiley, 2nd ed. 1979. The LO synthesizer 10 is comprised of a voltage controlled oscillator 100, a quadrature generator 101, an image canceling offset mixer 102, an offset VCO 103, a divide by N stage 104, a phase detector 105, and a loop filter 106. The LO synthesizer 10 provides the LO injection signal for the down-mixer stage 30. The offset mixer 102 and the offset VCO 103 provide a means of controlling the frequency of the LO injection signal to track variations in the carrier frequency of the incoming RF signal. The control voltage ($V_{steer}$) for the offset VCO 103 is typically derived from a secondary tracking PLL like that described by Heck in U.S. Pat. No. 5,079,526 entitled "Frequency Modulated Synthesizer Using Low Frequency Offset Mixer", herein incorporated by reference. Also shown in FIG. 1 are the RF amplifier and filter stage 111 and low-pass filter stage 40 of the direct conversion receiver.

The prior art LO synthesizer in FIG. 1 requires extensive redesign in order to achieve the single chip wide band transceiver IC discussed previously. The new LO synthesizer must operate in several modes which are receive, transmit, and battery save. For both the transmit and receive the synthesizer must be able to work from Low Band to UHF Band. Additional functional blocks will have to be added to accomplish this as well as modifications to existing prior art blocks to achieve the single chip wide band synthesizer.

Therefore there is a need for a LO synthesizer for use with a direct conversion transceiver that can be integrated into a single integrated circuit (IC). Additionally, the new LO synthesizer shall have other added requirements allowing it to operate in multiple modes while maintaining high performance.

DETAILED DESCRIPTION OF THE PREFERRED EMBODIMENT

Figure 1:
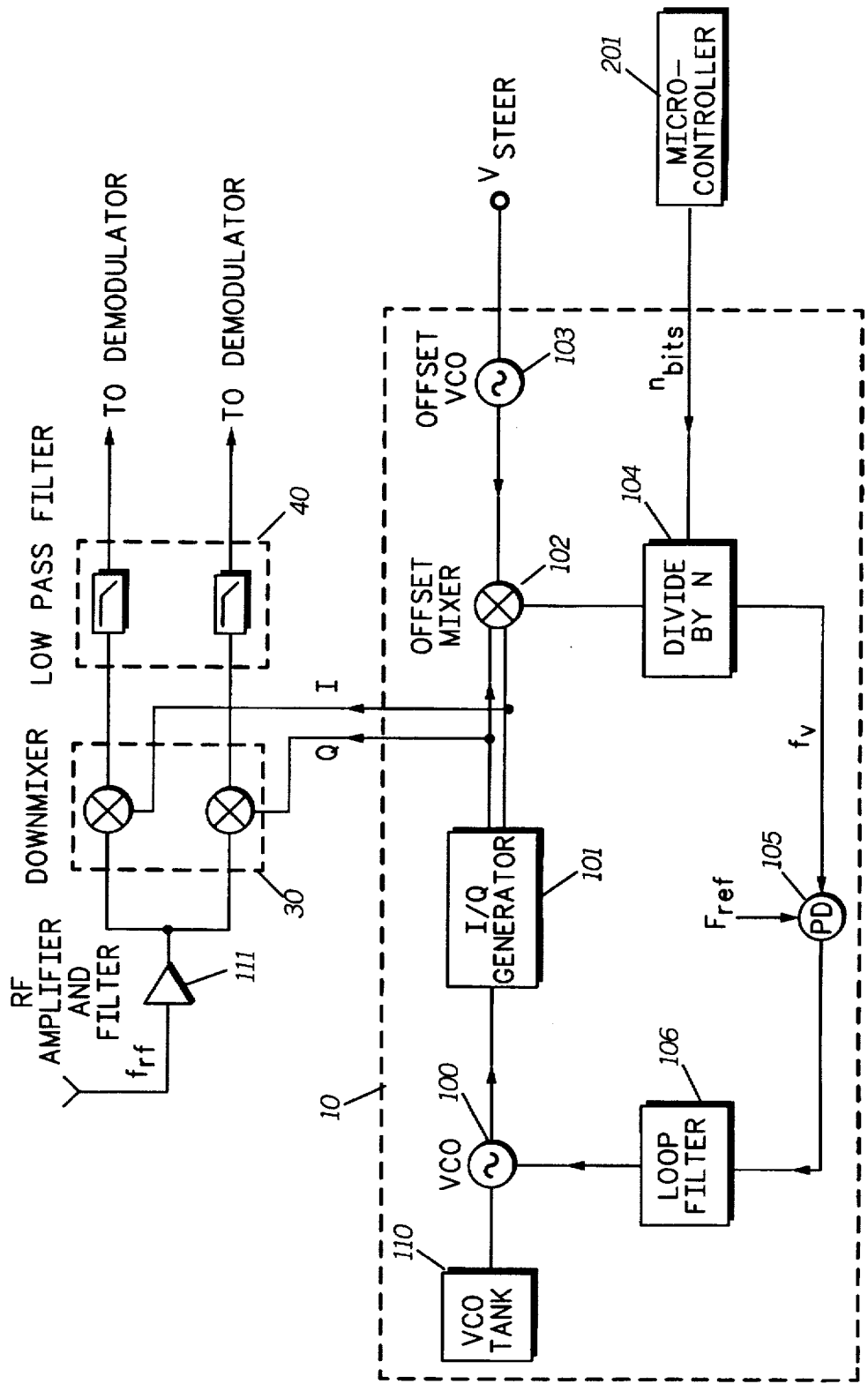
FIG. 1 is a prior art block diagram showing a LO frequency synthesizer used in a direct conversion receiver.
Figure 2:
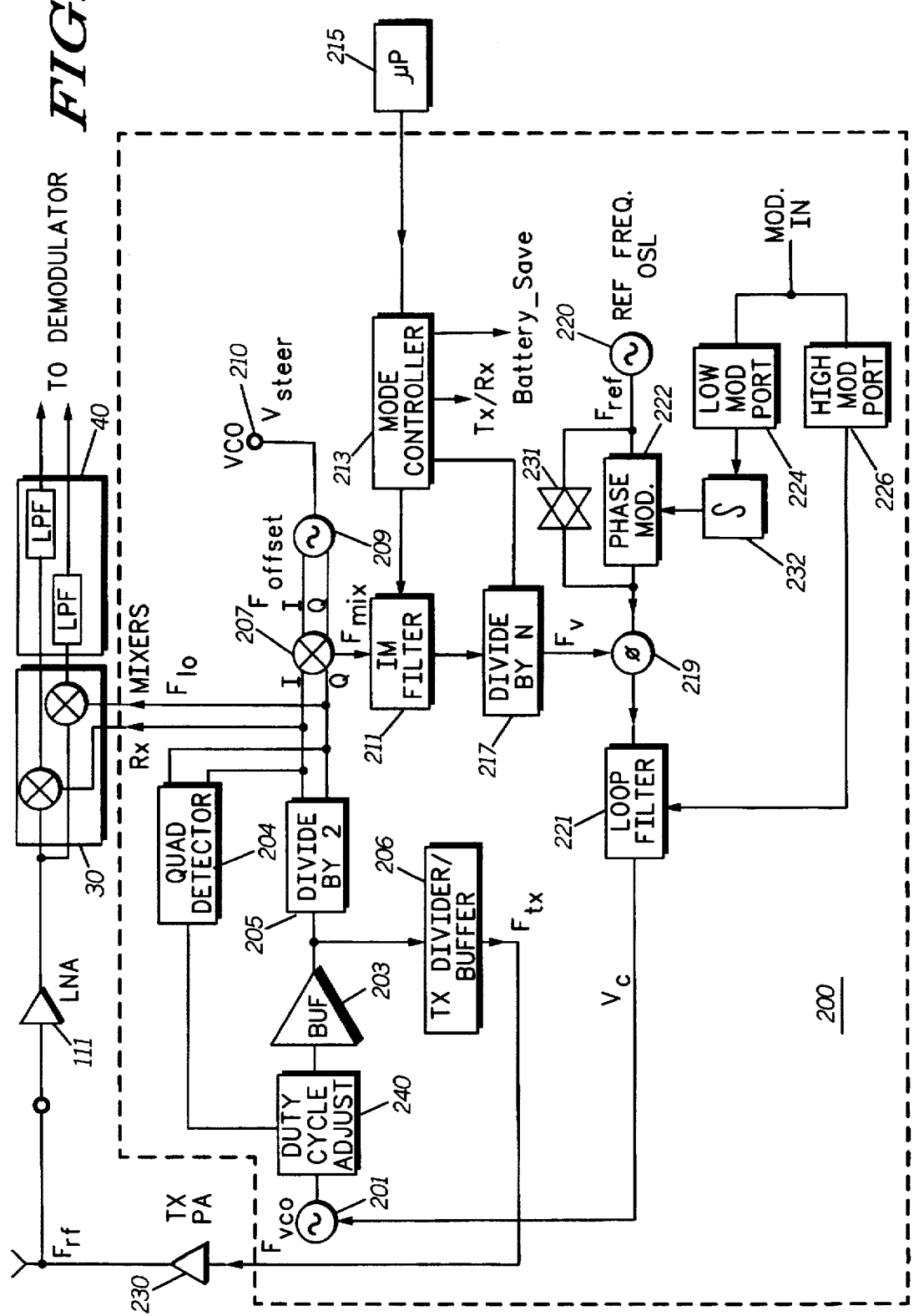
FIG. 2 is a block diagram showing an improved direct conversion transceiver frequency synthesizer according to the preferred embodiment of the invention.

Referring now to FIG. 2, a block diagram showing elements of an improved phase locked loop frequency synthesizer 200 that is used to supply a local oscillator (LO) signal in a wireless communications device to down conversion mixers 30 in the receive mode, and to provide a modulated carrier signal to the transmit power amplifier 230 in the transmit mode. The synthesizer 200 includes a voltage controlled oscillator (VCO) 201 for generating a stable continuous radio frequency signal ($F_{vco}$) with an operating center frequency between 80 Megahertz (MHz) and 1 Gigahertz (Ghz) and a VCO gain ($K_o$) typically between approximately 4–20 MHz/volt. In the receive (Rx) mode, the VCO 201 is operated at twice the incoming received frequency ($F_{rf}$) so as to provide a large frequency separation (x2) between the VCO signal and the incoming received signal ($F_{rf}$). In transmit (Tx) mode, the VCO 201 also operates at twice the transmitted signal ($F_{tx}$) that is input to the Tx divider/buffer stage 206.

The large frequency separation prevents the undesired coupling (i.e. crosstalk) between the VCO output signal at 201 that is input to buffer 203 and a transmit stage using a Tx output signal of Tx divider/buffer 206. This large frequency difference between the VCO frequency ($F_{vco}$) and the transmitted signal frequency ($F_{tx}$) is particularly important for single-chip implementation of synthesizer 200 because the circuits are implemented on a very small substrate. For the present invention, the substrate size is approximately 141×141 mils (0.36 millimeters×0.36 millimeters). Typically, the Tx output signal is 20–30 dB higher than the output signal of VCO 201. Since the VCO is operating at twice the Tx signal frequency, a high pass filter (not shown) can be placed between the VCO 201 and buffer 203. The high pass filter attenuates the undesired coupling of the lower frequency Tx output signal from reaching the input of buffer stage 203.

As best seen in FIG. 2, the VCO signal at the output of VCO 201 is then supplied to a buffer 203 where it is amplified and input to the IQ generator loop comprised of a divide-by-two divider stage 205, quadrature detector 204, duty-cycle adjust stage 240, and buffer 203. The IQ generator loop is used to generate two signals at the same amplitude and frequency but 90 degrees out of phase. The IQ generator loop controls the duty cycle of the input signal to divide-by-two divider stage 205. The two output signals (I and Q) of the divide-by-two stage will be in quadrature if the duty cycle of the signal input to the divide-by-two stage is approximately 50/50. The IQ generator loop is described by Gillig in U.S. Pat. No. 5,375,258 entitled "Circuit for Generating Signals in Phase Quadrature and Associated Method Therefor", herein incorporated by reference.

The I and Q signals at the output of the IQ generator loop are input to the Rx down conversion mixers 30. The quadrature components are required in the down conversion process of the incoming RF to baseband signal. This avoids loss of spectral components that would otherwise occur if only the I signal was input to the mixers 30. By using two mixers each having a local oscillator signal that is 90 degrees apart (i.e. I and Q), all frequency modulation information is retained without distortion.

The IQ output signals from the divide by two divider 205 are also supplied to an image balanced mixer 207 where these IQ signals are mixed with the IQ signals generated from the offset VCO 209. The purpose of mixing the LO signal with the offset VCO signal is to provide a means of varying the frequency of the LO signal ($F_{lo}$) to track variations in the frequency of the incoming RF signal ($F_{rf}$). The control voltage ($V_{steer}$) for the offset VCO 209 is derived from a secondary tracking PLL like that described by Heck in previously cited U.S. Pat. No. 5,079,526. The main purpose of the secondary tracking PLL is to phase lock the LO signal to the incoming RF signal to minimize the frequency error (i.e. netting error) that would otherwise result if the frequency of the LO signal differed from the frequency of the incoming RF signal ($F_{rf}$). As taught by Heck, the secondary PLL may also serve to provide a small offset frequency in the mixed down baseband signal. A small offset frequency such as 57 Hz allows the use of DC blocking capacitors in the baseband filters of the direct conversion receiver. The DC blocking capacitors are desirable to prevent large DC offsets in the baseband filters.

The signals presented to the image balanced or offset mixer 207 are the local oscillator IQ signals ($F_{lo}$) and the offset VCO IQ signals ($F_{offset}$). Since the offset mixer 207 will inherently cancel the undesired mixer component at $F_{lo}+F_{offset}$, the frequency of the remaining desired signal can then be represented as $F_{mix}=F_{lo}-F_{offset}$. This signal is input to IM filter 211.

Included within the offset mixer 207 output signal are a number of undesired intermodulation components (IM) that result as a mixing product of the LO IQ signals with the offset VCO IQ signals. These components are usually much higher in frequency than the desired frequency ($F_{mix}$) and are typically attenuated by the internal components of the offset mixer 207. The internal components include active and passive devices and their associated parasitic resistance and capacitance, which provide the high frequency filtering. However, since the LO operating frequency range of the present invention is large (40 MHz to 500 MHz), when operating at the low end of the range, these IM components can appear at the high end of the frequency operating range. If the amplitude of the IM component is substantially large compared to the amplitude of the desired signal (i.e. signal component at $F_{mix}$), then the IM component will cause unstable frequency division by the divide-by-N stage 217. In most instances the IM component which provides the largest interference is the fourth order component (IM4) at a frequency equal to $3 \times F_{lo}+F_{offset}$. For example, for an LO signal at 100 MHz and the nominal frequency of the offset VCO at 150 KHz, the undesired IM4 component will occur at $3 \times 100$ MHz+150 KHz=300.150 MHz. Theoretically, for a balanced mixer such as offset mixer 207, this component is 9.5 dB below the desired component. Undesired components should be at least 14 dB below the desired signal amplitude in order for the divide-by-N stage 217 to function properly with good stability.

Since IM4 signal component is within the 40–500 MHz operating range of offset mixer 207, it is necessary to filter the IM4 component from the output of the offset mixer 207. This is accomplished using IM filter 211, which is a variable bandwidth filter, programmed by microprocessor 215 through mode controller 213. Thus, at the low operating frequency range, 40 MHz, enough attenuation at the IM4 frequency, which is approximately 3*40 MHz=120 MHz, to get from 9.5 dB to 14 dB is needed. By putting a single pole around 60 MHz the frequency component at 120 MHz should be around 6 dB below the component at 40 MHz, thus eliminating any IM4 frequency component's effect on the divide-by-N stage 217.

Figure 3:
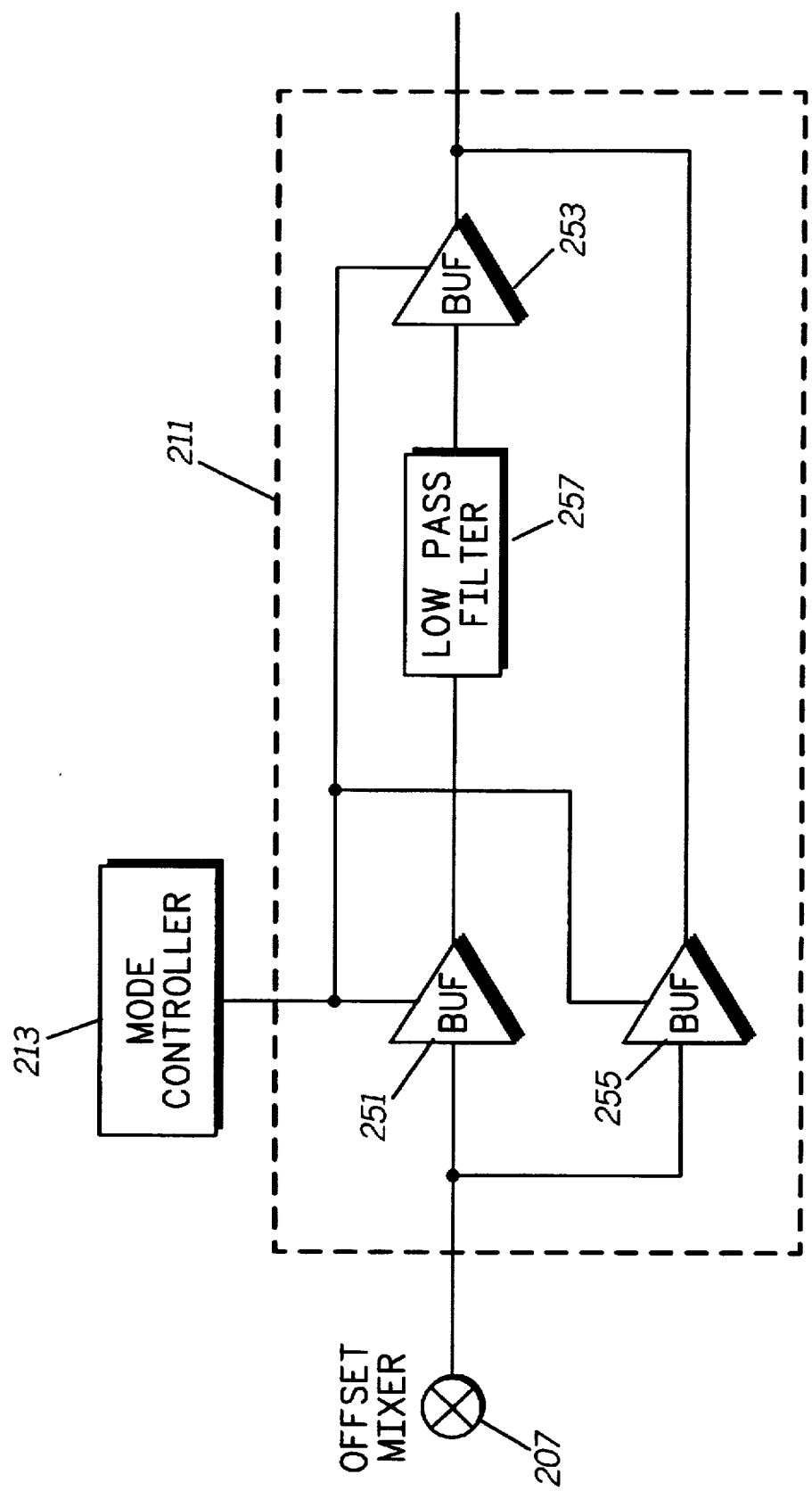
FIG. 3 is a block diagram showing details of an intermodulation (IM) filter in the frequency synthesizer as seen in FIG. 2.

FIG. 3 illustrates the operation of the IM filter 211. The microprocessor 215 in FIG. 2 makes the determination upon which LO frequency to operate. The microprocessor 215 then programs the mode controller 213 with the appropriate software instructions. The mode controller 213 changes the signal path by switching buffers 251, 253 and 255 to an ON or OFF state depending upon its programmed value. For an LO frequency less than 200 MHz, buffers 251 and 253 are ON while buffer 255 is programmed OFF. The signal path has a 60 MHz cutoff frequency determined by the low pass filter 257 where any IM4 signal greater than the cutoff frequency will be attenuated. The attenuation of the IM4 signal allows the divide-by-N stage 217 in FIG. 2 to operate properly without IM4 interference. For a LO frequency greater than 200 MHz, buffers 251 and 253 are programmed to an OFF state and buffer 255 is programmed to an ON state. Since the IM4 signal is extremely high in frequency (i.e. greater than 600 MHz), no low pass filter is needed since offset mixer stage 207 in FIG. 2 intrinsically filters frequencies in this range. Thus the IM filter 211 in FIG. 2 is a means to allow wide band LO operation from 40 MHz to 500 MHz since it eliminates the IM4 component from interfering with the divide by N stage 217.

The mode controller stage 213 in FIG. 2 is comprised of a serial shift register. Programming bits are serially fed into a register bank and latched into memory at the end of the programming cycle. RF channel information from microprocessor 215 is programmed into the serial shift register of controller 213. The channel information includes the binary bits that program the value of the divide-by-N stage 217 thereby setting the LO frequency of synthesizer 200. The microprocessor also sends information to the mode controller on the state of the IM filter 211. Similarly, the microprocessor determines which blocks are active for a given period of time. Each block is then activated/deactivated either through the Rx/Tx control line of the mode controller or with the battery save control line.

The signal at the output of the IM filter 211 is then input to a divide-by-N stage 217. The divide-by-N stage 217 is also controlled by the mode controller 213 and used to divide the frequency of the IM filtered signal from the IM filter 211 to a signal with frequency Fv that is input to phase detector 219. Also, input to phase detector 219 is the reference signal $F_{ref}$ from the output of the reference frequency generator 220. In the transmit mode, the Frf signal is modulated by phase modulator 222. In the receive mode, phase modulator 222 is bypassed by switch 231. Switch 231 is implemented with a complementary metal oxide semiconductor (CMOS) transmission gate and manipulated by controller 213. A single bit (Tx/Rx) in the serial register of mode controller 213 is used to program the synthesizer 200 in the transmit or receive mode. The signal $F_v$ at the output of the divide-by-N stage 217 has the relationship $F_v=F_{ref}$ when synthesizer 200 is phase locked.

The output of the divide-by-N stage 217 is fed to a phase detector 219 where it is compared with Fref. The output signal from the phase detector 219 is then supplied to a loop filter 221 to attenuate unwanted reference frequency components and/or spurious emissions. The loop filter also determines the type of control system. The type determines how the system will respond to frequency and phase errors. For the present invention, a type two system is preferred since it guarantees zero phase error with a step input at the phase detector 219 Fref input. The output voltage ($V_c$) of the loop filter 221 is then supplied to the VCO 201 where it controls the VCO's operating frequency. The loop filter 221 is comprised of a passive network of resistors and capacitors.

The low and high modulation ports 224 and 226 provide a means for dual-port modulation of the transmitted carrier frequency ($F_{tx}$). This is similar to the method proposed by Enderby, et. al. in U.S. Pat. No. 4,052,672 entitled "Extended Phase-Range, High Fidelity Modulation Arrangement", herein incorporated by reference. The input modulating signal (e.g. a voice or data signal) is applied to both the low frequency modulation port 224 and high frequency modulation port 226. Each modulation port consists of a resistive attenuator that is used to adjust the modulation level so that the overall modulation of the transmitted carrier is relatively flat over frequency. The output signal of low port stage 224 is input to integrator 232. Integration of the low port modulating signal is required prior to phase modulation to provide a frequency modulated signal at the output of phase modulator 222. The output signal of high port 226 is coupled into loop filter 221 to frequency modulate VCO 201 through the control voltage (Vc). In the present invention, the dual port modulation as shown in FIG. 2 provides the capability to modulate the transmitted carrier signal with audio frequencies ranging from 3 Hz to 20 KHz. The phase modulator 222, integrator 231, and modulation ports 224 and 226 are operational only during transmit mode.

Figure 4:
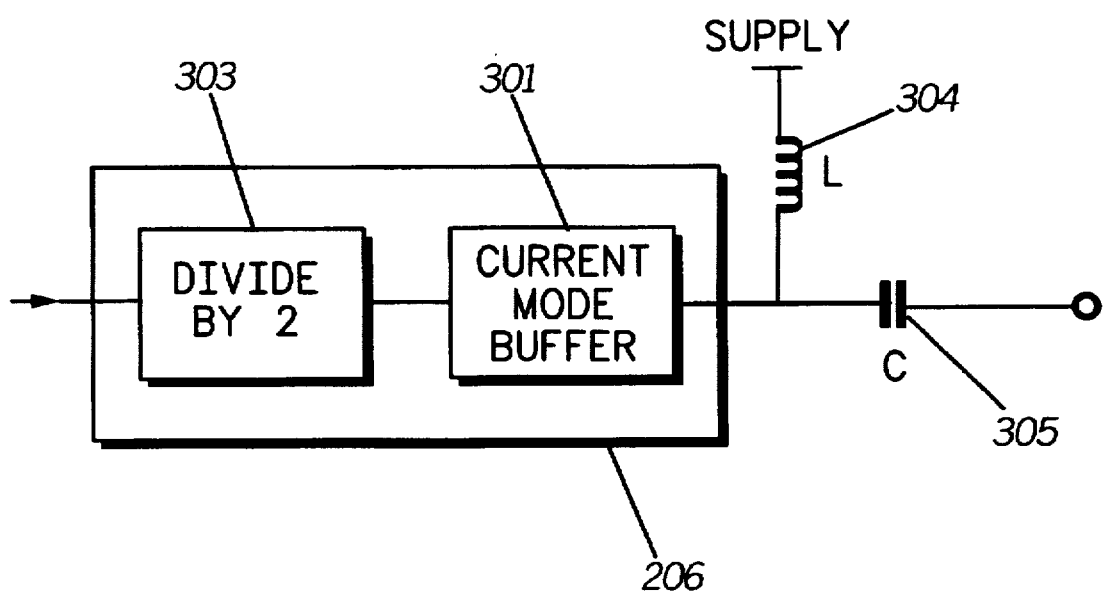
FIG. 4 is a detailed diagram of the transmit divider and buffer shown in FIG. 2.

When the transceiver is in the Tx mode the Tx divider and buffer stage 206 is activated. Referring now to FIG. 4, the input signal to the Tx divider and buffer stage 206 is input into a divide-by-two stage to translate the signal down to the Tx frequency. The signal is then fed into a current mode buffer. Current mode buffers are advantageous because they generally have a wide band of frequency operation. As mentioned previously, the operating range is from 40 MHz to 500 MHz so the Tx current mode buffer 301 must operate in this range. Also, the divider must operate between 80 MHz and 1 GHz; twice the range since it is a divide by two stage. The output power of the transmit buffer was designed to be between 3–5 dBm. This will depend upon the supply voltage used, but for the nominal case 3 dBm is expected. A higher supply voltage could be used to get more power out than the standard chip supply of 2.75 volts. The inductor 304 and capacitor 305 provide the match to the Tx power amplifier 230 in FIG. 2.

The synthesizer 200 may be programmed into a battery save mode to reduce current drain and thereby extend battery life for portable applications. A single bit in the serial register of mode controller 213 programmed either to an ON or to an OFF state by microprocessor 215 that is used for this purpose. This control line (Battery_Save) is routed to each circuit block in synthesizer 200. Within each block are bias circuits which provide the voltage and current references for the internal circuitry. Each bias circuit is then controlled by the single bit serial register. It will be evident to those skilled in the art how to implement such circuits and are included in such texts as Gray P. R., and Meyer R. G., "Analog Integrated Circuits" New York: Wiley, 3rd ed. 1993. For clarity, the control lines are not drawn to each stage in FIG. 2.

In addition, the Battery_Save control line is used to tristate the output of phase detector 219. By effectively disconnecting the output of phase detector 219 from loop filter 221, Vc at the output of the loop filter is retained while the synthesizer is powered off. Upon power up in either the transmit or receive modes, the synthesizer's lock time is greatly improved because Vc was retained during the OFF time interval.

The mode controller 213 also serves to reconfigure the offset mixer 207 and the offset VCO 209 in the transmit mode. These circuits provide a means of frequency tracking in the receive mode and are not required in the transmit mode. In addition, the offset VCO and offset mixer generate unwanted signals which can couple into the transmit circuits and introduce unwanted spurious components. By programming the offset VCO 209 to an OFF state in the transmit mode, offset mixer 207 is converted from a mixer to a buffer stage. The offset system required in receive mode is now removed in transmit mode.

In summary, one of the important new components included in the wideband frequency synthesizer for a direct conversion transceiver discussed herein, is the mode controller. The mode controller reconfigures the transceiver in the different modes. This controller can be used to optimize system performance. For example, the controller will power down unnecessary circuits while in the transmit mode in order to minimize spurious transmit signals. Additional functional blocks will be needed to modulate the signal during transmit. Dual port modulation will be the preferred method to maintain audio flatness during transmit. This method injects the transmit audio signal into two gain programmable synthesizer ports in order to both phase and frequency modulate the carrier. The offset mixer will require a programmable filter at the output to allow wide band operation. A detail discussion on this is in the Preferred Embodiment section. A transmit divide by two stage and amplifier are needed to buffer, amplify, and frequency translate the VCO signal for the power amplifier. Printed circuit board layout planning for isolation purposes and bypass filters will be needed to prevent the amplified transmit signal from interfering with the lower level VCO signal in the transmit mode, and a means of preventing the VCO signal from interfering with the incoming RF signal in the receive mode. Finally, battery save must be designed into the circuits to allow the user to shut down systems temporarily to reduce the average current drain. This is very important for portable FM radios where current drain needs to be minimized.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A phase-lock loop (PLL) frequency synthesizer comprising:
   a voltage controlled oscillator (VCO) for providing a VCO signal at a predetermined frequency;
   a buffer for adjusting a duty cycle of the VCO signal and providing a buffered signal;
   a first divider for reducing the frequency of the buffered signal to provide a first divided signal;
   a quadrature detector for detecting the first divided signal and providing a duty cycle feedback control to the buffer;
   an offset VCO for providing an external means of varying the frequency of the PLL frequency synthesizer;
   an offset mixer for combining the first divided signal with an offset signal to produce a mixed signal;
   at least one intermodulation filter for removing predetermined intermodulation components of the mixed signal and providing a filtered signal;
   a second divider for reducing the frequency of the filtered signal;
   a phase detector for detecting a phase difference between a reference signal and the filtered signal and providing a phase difference signal proportional thereto;
   a loop filter for filtering unwanted components from the phase difference signal;
   a phase modulator for providing low frequency modulation of the PLL frequency synthesizer; and
   a transmit stage for dividing and providing a buffered signal to a transmit power amplifier.

2. A PLL frequency synthesizer as in claim 1 wherein the phase detector includes at least one integrator.

3. A PLL frequency synthesizer as in claim 1 wherein the loop filter determines a PLL system type.

4. A PLL frequency synthesizer as in claim 1 operates in either a receive, transmit or battery save mode.

5. A PLL frequency synthesizer as in claim 1 wherein the at least one intermodulation filter operates automatically for adjusting a cutoff frequency for wideband radio frequency (RF) operation.

6. A PLL frequency synthesizer as in claim 1 wherein the offset mixer may be reconfigured as a buffer stage to reduce spurious emissions when the PLL frequency synthesizer operates in a transmit mode.

7. A PLL frequency synthesizer as in claim 1 wherein the VCO operates at a frequency that is twice the transmission frequency of the PLL frequency synthesizer for improving isolation between the VCO and the transmitted signal.

8. A wideband phase-lock loop frequency synthesizer comprising:
   a voltage controlled oscillator for generating a radio frequency (RF) signal;
   an offset mixer for combining the RF signal and an offset signal to produce a mixed signal;
   an intermodulation filter for eliminating unwanted intermodulation components of the mixed signal and providing a filtered signal;
   a divider for reducing the frequency of the filtered signal;
   a phase detector for altering the phase of the filtered signal and providing a phase altered signal; and
   a loop filter for removing spurious components of the phase altered signal and providing a feedback signal to the voltage controlled oscillator.

9. A wideband phase-lock loop frequency synthesizer as in claim 8 wherein the offset mixer acts to cancel an unwanted image signal created from multiplied frequency sinusoids within the offset mixer.

10. A wideband phase-lock loop frequency synthesizer as in claim 8 wherein the intermodulation filter is controlled such that its cutoff frequency is dependent on a local oscillator frequency.

11. A wideband phase-lock loop frequency synthesizer as in claim 8 further comprising an offset voltage controlled oscillator for providing an offset signal having a controllable frequency.

12. A wideband phase-lock loop frequency synthesizer as in claim 8 further comprising a mode controller for reconfiguring the wideband phase-lock loop frequency synthesizer for operation in either of a transmit, receive or battery save modes.

13. A wideband phase-lock loop oscillator comprising:
   a voltage controlled oscillator (VCO) for providing a radio frequency (RF) signal over a substantially wide range;
   a first divider for reducing the frequency of the RF signal and provided a first divided signal;
   a quadrature detector for altering the phase of the first divided signal to provide a first and a second quadrature signal to the first divider;
   an offset mixer for combining the first and second quadrature signal from the quadrature detector with an offset voltage controlled oscillator signal to provide a offset mixed signal;
   a second divider for reducing the frequency of the offset mixed signal to provide a second divided signal;
   a phase detector for varying the phase of the second divided signal of the second divider and providing a detected signal; and
   a loop filter for removing unwanted harmonic components of the detected signal to provide a filtered signal and for supplying the filtered signal to the VCO.

14. A wideband phase-lock loop oscillator as in claim 13 wherein the oscillator may be reconfigured to operate in either a transmit, receive or battery save mode.

15. A wideband phase-lock loop oscillator as in claim 13 further comprising at least one intermodulation filter for automatically adjusting a cutoff frequency of the oscillator for reducing unwanted signal components.

16. A wideband phase-lock loop oscillator as in claim 13 wherein the offset mixer may be reconfigured as a buffer stage to reduce spurious emissions when used in a transmit mode.

* * * * *